Nov. 28, 1961 W. H. WOBIG 3,011,116

TEMPERATURE COMPENSATION IN SEMICONDUCTOR DEVICES

Filed March 4, 1957

INVENTOR
WILLIAM H. WOBIG
BY T. L. Styner
ATTORNEY 3,011,116

TEMPERATURE COMPENSATION IN SEMICONDUCTOR DEVICES

William H. Wobig, Rochester, N.Y., assignor to General Dynamics Corporation, Rochester, N.Y., a corporation of Delaware Filed Mar. 4, 1957, Ser. No. 643,690
7 Claims. (Cl. 321—8)

This invention relates to temperature compensation in semiconductor devices used in electronic networks.

The object of the invention is to provide means for stabilizing the response of an electronic network particularly in the region where the normal respose of certain semiconductor devices is known to be variable and not of the highest degree of stability.

The invention is embodied in a diode peak detector in which a diode is used to rectify an alternating current to produce a corresponding direct current output. Semiconductor diodes have many advantages for this purpose including economy and small size but possess a disadvantageous characteristic relationship between forward voltage and forward current. This relationship varies with temperature so that in a certain range the response of the diode becomes troublesome and unreliable.

The diode characteristics show that a significant voltage has to be applied before a current begins to flow, in other words the zero current intercept corresponds to a sizable forward voltage and since this varies also with temperature it is difficult to bias the diode to shift the characteristic curve to pass through the intersection of the zero coordinates.

The invention consists of the provision of biasing means which varies with temperature in the same manner as the diode whereby the characteristic may be shifted with changes in temperature so as to at all times present a uniform relationship between forward voltage and forward current. In this manner the output of the device may be made to present a true reflection of the input.

In accordance with this invention a pair of like diodes are employed one for the principal function of the device and the other, which varies in its characteristics in the same manner, as a variable biasing means. Such pair of diodes are mounted so as to be subjected to the same ambient conditions.

A feature of the invention is a diode in a rectifier circuit biased to its zero current intercept whereby any significant additional potential applied thereto will cause a significant and proportional current flow therethrough. Where such a diode is so adjusted that there will be a response to any applied potential, the output of the said rectifier circuit will be useful even in the very low potential range.

Another feature of the invention is the use of a biasing means which varies inversely with temperature and which may be applied to a diode whose zero current intercept decreases with temperature whereby the diode may be substantially adjusted to maintain a characteristic with a zero current intercept steadily at a zero applied voltage value. In accordance with this feature a source of regulated direct current supplies, through a resistor, a bias voltage. This voltage, beside being connected to a drain circuit including a diode which allows the drain current to increase with temperature and by thus increasing the current flow through the said resistor increases the drop therein and thus decreases the potential at the said biasing point.

Other features will appear hereinafter.

The drawings consist of a single sheet having three figures, as follows.

Figures 2, 3:
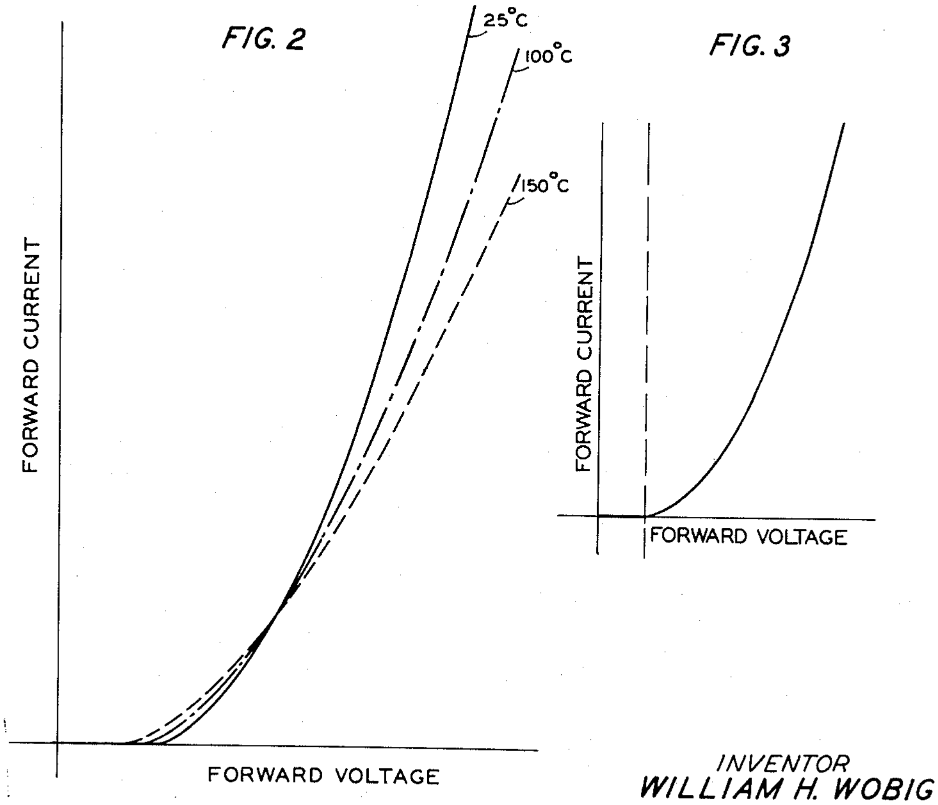
FIG. 2 is a nest of graphs showing the forward characteristics of diodes which may be used for the purposes of the present invention.
FIG. 3 is a single like graph showing the zero voltage reference coordinate shifted to the right so that the graph representing the characteristics of the diode passes directly through the point of origin.

Looking first at FIG. 2 it will be noted that there must be a significant forward voltage before any current flow is produced. It may further be noted that the value of this forward voltage changes with temperature, decreasing as the temperature increases. In order to render the diode most useful for the purposes of the present invention, the graph of its characteristics must be effectively shifted so that it will pass through the point of origin, as indicated in FIG. 3.

This may be done by biasing the diode so that at zero current the graph also intercepts the voltage reference coordinate. However, it will be seen from the nest of curves in FIG. 2 that this point varies with temperature, rendering the significant voltage bias less as the temperature becomes greater.

Figure 1:
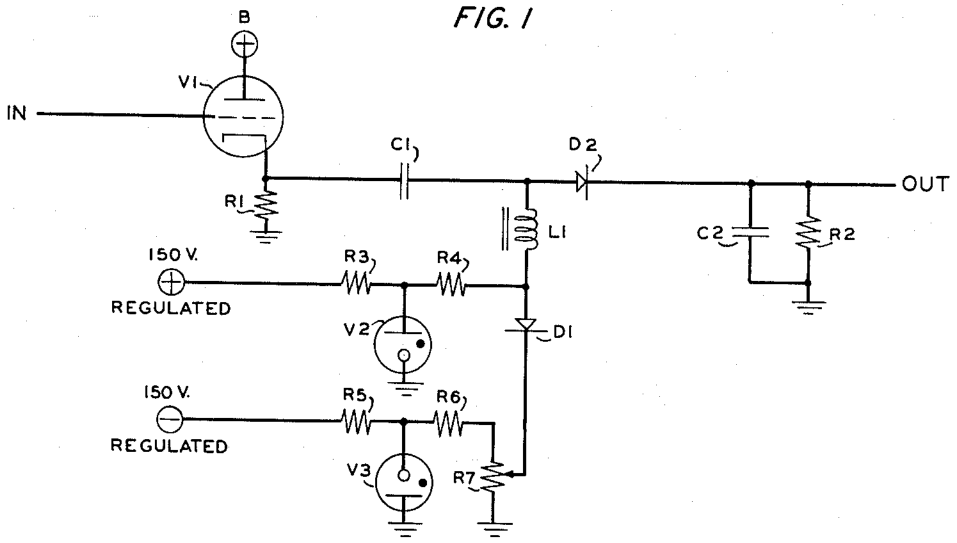
FIG. 1 is a schematic circuit diagram of an electronic network in which a diode is used as a means for deriving a direct current output proportional to a sine wave alternating current input and including a biasing means depending on a like diode.

In FIG. 1 a triode V1 is used as a cathode follower device to pass an input signal into the grid thereof and a corresponding signal from the cathode thereof. This signal is passed by the coupling condenser C1 to the diode D2 whereupon the signal is transformed into a direct current voltage across the load resistor R2 and its condenser C2.

In order to virtually shift the characteristic of this diode D2 as indicated in FIG. 3, a bias is applied to the diode and is adjusted so that with zero current in the signal circuit the voltage across this diode will be sufficient to produce a current flow proportional to the applied signal.

This bias is derived from a source of regulated direct current, adjusted in value and rendered more stable by the use of gas diode V2 connected in a network including the resistors R3 and R4, and thereafter connected, in the example illustrated, to the anode of diode D2 through an inductance coil L1. As a further means of adjusting this bias and rendering it automatically variable with temperature in as nearly as possible the same degree of variation required at the anode of the diode D2, a like diode D1 is connected to the junction between R4 and L1 as a drain circuit whereby as the current therein increases with temperature, the drop in R4 likewise increases with temperature so that the potential at the anode of D1 correspondingly drops with temperature. Thus as temperature increases the bias applied to D2 decreases.

In order to adjust the zero current in the signal circuit, a regulated source of negative direct current connected to a stabilizing network including a gas diode V3, fixed resistors R5 and R6 and a rheostat R7 is employed for the cathode of the diode D1. By means of the rheostat R7 the bias applied to the anode of D2 at any given temperature, say room temperature, may be adjusted so that thereafter this bias will change automatically with change in temperature.

What is claimed is:

1. In an electric network, means for translating an incoming alternating current into an outgoing direct current consisting of a diode feeding into an output circuit and means coupled across said diode for biasing one electrode of said diode with respect to the other to bring the zero voltage intercept of the voltage-current characteristic of the diode to or near the zero current intercept thereof.

2. In an electronic network, a diode having a characteristic relation between forward voltage applied thereto and forward current flowing therethrough in which the zero current intercept is at a significant forward voltage value, means for virtually shifting said characteristic to pass through the origin of coordinates by which said characteristic is expressed, consisting of means for applying a bias voltage across said diode equal to said significant forward voltage.

3. In an electronic network, a diode having a characteristic relation between voltage applied thereto and forward current flowing therethrough in which the zero current intercept is at a significant forward voltage value and in which said significant forward voltage value varies inversely with temperature, means for virtually shifting said characteristic to pass through the origin of coordinates by which said characteristic is expressed consisting of means for applying a static bias which decreases with increasing temperature across said diode substantially equal to said significant forward voltage.

4. In an electronic network, a diode having a characteristic relationship between forward current and forward voltage in which the zero current intercept is at a substantial forward voltage value and in which said substantial forward voltage value changes inversely with temperature, a source of direct current potential connected across said diode for biasing said diode an amount substantiallly equal to said substantial forward voltage and a similar and substantially matched diode connected to said source for changing said bias inversely with temperature.

5. In an electronic network, a diode having a characteristic relationship between forward current and forward voltage in which the zero current intercept is at a substantial forward voltage value and in which said substantial forward voltage value changes inversely with temperature, a source of direct current potential for biasing said diode to give said substantial forward voltage value and a similar and substantially matched diode for changing said bias inversely with temperature, said two diodes being mounted together to be subjected to the same temperature changes.

6. In an electronic network, a diode, means for changing the zero-current voltage bias of said diode with change in ambient temperature, consisting of a regulated source of direct current, a voltage divider enabled therefrom, said voltage divider including as an element thereof a like and substantially matched diode to vary the voltage of a point in said voltage divider with changes in temperature and a rheostat means for regulating the voltage of said point at a given value with respect to temperature, said point in said voltage divider being adjusted to a voltage substantially equal to said zero-current voltage and being connected to the anode of said first diode and said two diodes being arranged to be subjected to the same temperature changes.

7. In an electronic network, a first diode of the type in which the zero-current voltage varies with ambient temperature, means for compensating said diode for changes in ambient temperature consisting of a regulated source of direct current, a voltage divider enabled therefrom, an element in said voltage divider consisting of a second diode like said first diode and a biasing connection between the anode of said first diode and said voltage divider so that the bias of said first diode remains substantially equal to said zero-current voltage throughout the operating range of said ambient temperature, said two diodes being mounted together to be subjected to the same ambient temperatures.

References Cited in the file of this patent

UNITED STATES PATENTS

| | | |
|---|---|---|
| 2,452,551 | Conant | Nov. 2, 1948 |
| 2,571,458 | Lawrence et al. | Oct. 16, 1951 |
| 2,759,111 | Wideroe | Aug. 14, 1956 |
| 2,802,071 | Lin | Aug. 6, 1957 |
| 2,877,451 | Williams | Mar. 10, 1959 |
| 2,957,089 | Curtis | Oct. 18, 1960 |